(12) United States Patent
Wang et al.

(10) Patent No.: US 8,890,250 B2
(45) Date of Patent: Nov. 18, 2014

(54) ELECTROSTATIC DISCHARGE PROTECTION STRUCTURE

(71) Applicant: United Microelectronics Corporation, Hsinchu (TW)

(72) Inventors: Chang-Tzu Wang, Taoyuan County (TW); Yu-Chun Chen, Hsinchu County (TW); Tien-Hao Tang, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 45 days.

(21) Appl. No.: 13/729,037

(22) Filed: Dec. 28, 2012

(65) Prior Publication Data

US 2014/0183596 A1 Jul. 3, 2014

(51) Int. Cl.
*H01L 23/62* (2006.01)
*H01L 29/739* (2006.01)

(52) U.S. Cl.
CPC .................................. *H01L 29/7393* (2013.01)
USPC ............................ 257/360; 257/355; 257/361

(58) Field of Classification Search
USPC ........................................................ 257/360
See application file for complete search history.

(56) References Cited

U.S. PATENT DOCUMENTS

| | | | |
|---|---|---|---|
| 6,114,226 A | 9/2000 | Chang | |
| 6,765,771 B2 * | 7/2004 | Ker et al. | 361/56 |
| 6,838,734 B2 | 1/2005 | Ker | |
| 6,878,996 B2 * | 4/2005 | Rothleitner | 257/341 |
| 6,879,003 B1 * | 4/2005 | Cheng et al. | 257/355 |
| 6,882,009 B2 * | 4/2005 | Ker et al. | 257/349 |
| 7,012,305 B2 * | 3/2006 | Su et al. | 257/355 |
| 7,064,407 B1 * | 6/2006 | Mallikarjunaswamy | 257/471 |
| 7,211,863 B2 * | 5/2007 | Williams et al. | 257/338 |
| 7,253,480 B2 * | 8/2007 | Chen et al. | 257/355 |
| 7,288,449 B2 | 10/2007 | Ker | |
| 7,465,995 B2 * | 12/2008 | Chu et al. | 257/361 |
| 7,655,980 B1 * | 2/2010 | Chao et al. | 257/335 |
| 7,795,681 B2 * | 9/2010 | Williams et al. | 257/349 |
| 7,906,810 B2 * | 3/2011 | Wang et al. | 257/335 |
| 7,910,998 B2 | 3/2011 | Hwang | |
| 8,283,973 B2 * | 10/2012 | Hashimoto et al. | 327/537 |
| 8,299,544 B2 * | 10/2012 | Abou-Khalil et al. | 257/401 |
| 8,530,298 B2 * | 9/2013 | Roybal et al. | 438/202 |
| 8,530,969 B2 * | 9/2013 | Chen et al. | 257/356 |
| 2002/0122280 A1 * | 9/2002 | Ker et al. | 361/56 |
| 2002/0130390 A1 * | 9/2002 | Ker et al. | 257/546 |
| 2004/0043568 A1 * | 3/2004 | Ker et al. | 438/279 |
| 2004/0190209 A1 * | 9/2004 | Jozwiak et al. | 361/56 |
| 2005/0045956 A1 * | 3/2005 | Chen et al. | 257/355 |
| 2005/0133868 A1 * | 6/2005 | Su et al. | 257/355 |
| 2008/0191277 A1 * | 8/2008 | Disney et al. | 257/343 |
| 2010/0019318 A1 * | 1/2010 | Chao et al. | 257/336 |
| 2010/0032758 A1 * | 2/2010 | Wang et al. | 257/343 |
| 2010/0193869 A1 * | 8/2010 | Habasaki | 257/360 |

(Continued)

*Primary Examiner* — Earl Taylor
(74) *Attorney, Agent, or Firm* — Ding Yu Tan

(57) ABSTRACT

An electrostatic discharge protection structure includes a semiconductor substrate, a first well region, a gate structure, a second well region, a second well region, a second conductive region, and a deep well region. The first well region contains first type conducting carriers. The second well region is disposed within the first well region, and contains second type conducting carriers. The first conductive region is disposed on the surface of the first well region, and contains the second type conducting carriers. The deep well region is disposed under the second well region and the first conductive region, and contacted with the second well region. The deep well region contains the second type conducting carriers.

14 Claims, 17 Drawing Sheets

(56) References Cited

U.S. PATENT DOCUMENTS

2012/0139013 A1* 6/2012 Bahl et al. .................... 257/266
2012/0168878 A1* 7/2012 Abou-Khalil et al. ........ 257/401
2012/0205744 A1* 8/2012 O et al. ........................ 257/352
2013/0105904 A1* 5/2013 Roybal et al. ................ 257/369
2013/0207184 A1* 8/2013 Chen et al. ................... 257/339
2014/0070361 A1* 3/2014 Benaissa et al. ............. 257/509

* cited by examiner

ELECTROSTATIC DISCHARGE PROTECTION STRUCTURE

FIELD OF THE INVENTION

The present invention relates to an electrostatic discharge protection structure, and more particularly to an electrostatic discharge protection structure for a semiconductor integrated circuit device.

BACKGROUND OF THE INVENTION

In the process of producing or using a semiconductor integrated circuit device, electrostatic discharge (ESD) may result in sudden flow of electricity. The sudden flow of electricity may cause damage to the semiconductor integrated circuit device or the functional circuit, and reduce the production efficiency and the product yield.

For reducing the influence of the high ESD current on the semiconductor integrated circuit device, an electrostatic discharge protection structure is integrated into the semiconductor integrated circuit device. Generally, once the electrostatic discharge protection structure is triggered, the holding voltage of the electrostatic discharge protection structure in a snapback breakdown condition may be pulled down to a low voltage. If the holding voltage is lower than a high power supply voltage of the integrated circuit device, the high-voltage integrated circuit device is susceptible to the latchup-like danger in the real life application system.

Therefore, there is a need of providing an electrostatic discharge protection structure to eliminate the above drawbacks.

SUMMARY OF THE INVENTION

In accordance with an aspect, the present invention provides an electrostatic discharge protection structure. The electrostatic discharge protection structure includes a semiconductor substrate, a first well region, a gate structure, a second well region, a second well region, a second conductive region, and a deep well region. The first well region is disposed in the semiconductor substrate, and contains first type conducting carriers. The gate structure is disposed over a surface of the first well region. The second well region is disposed within the first well region and located at a first side of the gate structure. The second well region contains second type conducting carriers. The first conductive region is disposed on the surface of the first well region, and arranged between the gate structure and the second well region, wherein the first conductive region contains the second type conducting carriers. The second conductive region is disposed on the surface of the first well region, and the located at a second side of the gate structure, wherein the second conductive region contains the second type conducting carriers. The deep well region is disposed under the second well region and the first conductive region, and contacted with the second well region. The deep well region is separated from the first conductive region by the first well region. The deep well region contains the second type conducting carriers. Preferably, the concentration of the second type conducting carriers of the deep well region may be lower than the concentration of second type conducting carriers of the second well region.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
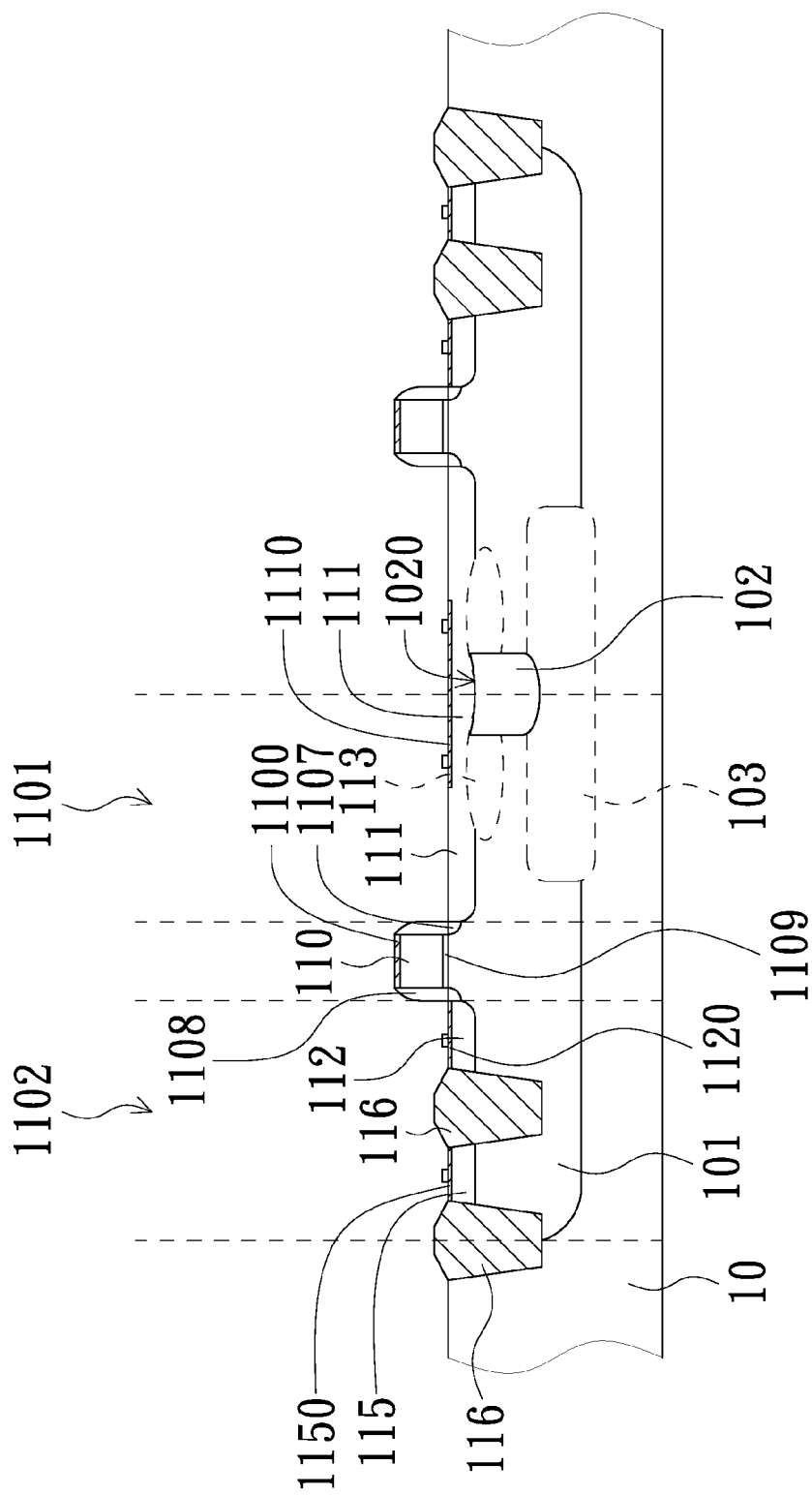
FIG. 1A is a schematic cross-sectional view illustrating an electrostatic discharge protection structure according to a first embodiment of the present invention.
Figure 1B:
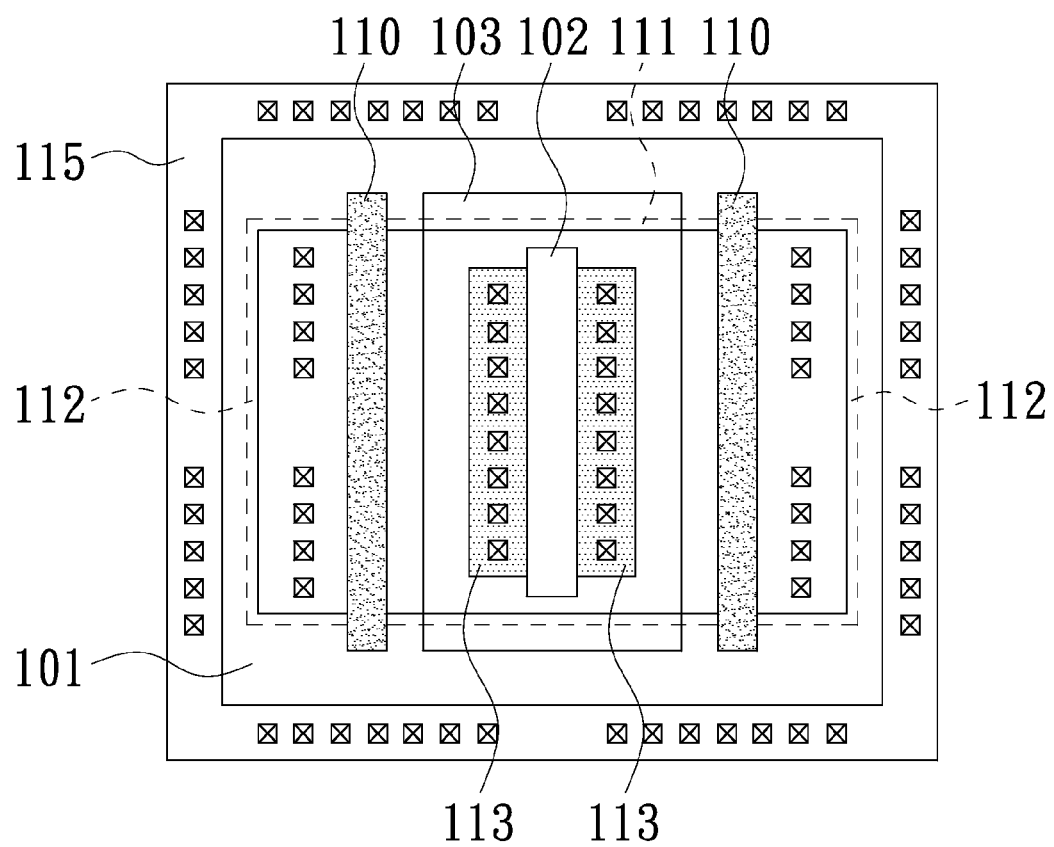
FIG. 1B is a schematic top view illustrating the electrostatic discharge protection structure of FIG. 1A.
Figure 1C:
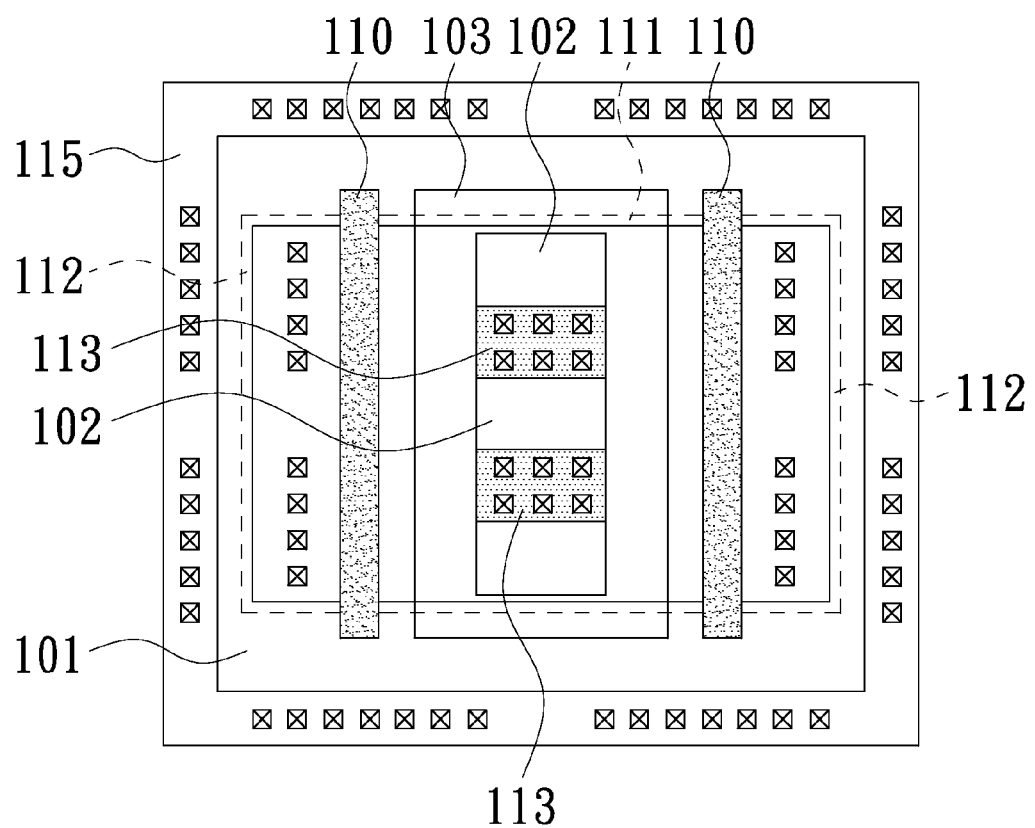
FIG. 1C is a schematic top view illustrating a variation of the electrostatic discharge protection structure of FIG. 1A.

Hereinafter, an electrostatic discharge protection structure according to a first embodiment of the present invention is illustrated in FIGS. 1A~1C.

FIG. 1A is a schematic cross-sectional view illustrating an electrostatic discharge protection structure according to the first embodiment of the present invention. In this embodiment, the electrostatic discharge protection structure is implemented by a metal-oxide-semiconductor. The metal-oxide-semiconductor is constructed in a semiconductor substrate 10. A first well region 101 with first type conducting carriers is formed in the semiconductor substrate 10. In this embodiment, the first type conducting carriers are hole carriers. That is, the first well region 101 is a P well region. A gate structure 110 of the metal-oxide-semiconductor is disposed over a surface of the first well region 101. The gate structure 110 comprises a gate dielectric layer 1109, a gate sidewall 1108, and a lightly doped drain region 1107. A first conductive region 111 is used as a drain region of the metal-oxide-semiconductor structure. The first conductive region 111 is disposed on the surface of the first well region 101, and is located at a first side 1101 of the gate structure 110. A second conductive region 112 is used as a source region of the metal-oxide-semiconductor structure. The second conductive region 112 is disposed on the surface of the first well region 101, and located at a second side 1102 of the gate structure 110. The first conductive region 111, the first well region 101 and the second conductive region 112 collaboratively define a parasitic bipolar junction transistor. The parasitic bipolar junction transistor provides a current path for discharging the electrostatic discharge current. For achieving desired electrical properties, the first conductive region 111 is wider than the second conductive region 112.

A second well region 102 is disposed within the first well region 101, and located at the first side 1101 of the gate structure 110. A top surface 1020 of the second well region 102 is contacted with the first conductive region 111. The second well region 102 contains second type conducting carriers. Both of the first conductive region 111 and the second conductive region 112 contain the second type conducting carriers. In this embodiment, the second type conducting carriers are electron carriers. Consequently, the first conductive region 111 and the second conductive region 112 are n+ regions, wherein the concentration of the second type conducting carriers of the second well region 102 is lower than the concentration of the second type conducting carriers of the n+ regions.

Moreover, a deep well region 103 is disposed under the second well region 102 and the first conductive region 111, and contacted with the second well region 102. The deep well region 103 contains the second type conducting carriers. The deep well region 103 is also separated from the first conductive region 111 by the first well region 101. The concentration of the second type conducting carriers (e.g. electron carriers) of the deep well region 103 is lower than the concentration of the second type conducting carriers of the second well region 102. The combination of the second well region 102 and the deep well region 103 also provides an additional current path for discharging the electrostatic discharge current. Generally, if the current path provided by the parasitic bipolar junction transistor results in a snapback breakdown condition, the holding voltage of the electrostatic discharge protection structure may be pulled down to a very low voltage. Due to the additional current path provided by the combination of the second well region 102 and the deep well region 103, the above drawbacks can be effectively solved.

Moreover, a third conductive region 113 is arranged between the second well region 102, the first conductive region 111 and the deep well region 103. The third conductive region 113 contains the first type conducting carriers (e.g. hole carriers). The concentration of the first type conducting carriers of the third conductive region 113 is higher than the concentration of the first type conducting carriers of the first well region 101. The third conductive region 113 is separated from the deep well region 103 by the first well region 101. In this embodiment, the third conductive region 113 is formed by performing an implantation process to implant P-type dopants into the first well region 101 to increase concentration of the hole carriers. Moreover, since the third conductive region 113 is contacted with a bottom surface of the first conductive region 111, a high-concentration PN junction is formed between the third conductive region 113 and the first conductive region 111. The PN junction is effective to reduce the breakdown voltage of the parasitic bipolar junction transistor. Moreover, a drain contact region 1110 is disposed on a surface of the first conductive region 111. The second well region 102 is disposed under the drain contact region 1110. In addition, the entire second well region 102 is covered by a projection area of the drain contact region 1110. A source contact region 1120 is disposed on a surface of the second conductive region 112. A gate contact region 1100 is disposed on a surface of the gate structure 110. Moreover, a fifth conductive region 115 is disposed within the first well region 101 and arranged between two isolation structures 116. The fifth conductive region 115 contains the first type conducting carriers (e.g. hole carriers). The concentration of the first type conducting carriers of the fifth conductive region 115 is higher than the concentration of the first type conducting carriers of the first well region 101. In addition, a body contact region 1150 is formed on a surface of the fifth conductive region 115.

For saving space of the layout area, the electrostatic discharge protection structure has a symmetrical shared source region. FIG. 1B is a schematic top view illustrating the electrostatic discharge protection structure of FIG. 1A. FIG. 1C is a schematic top view illustrating a variation of the electrostatic discharge protection structure of FIG. 1B. Except for the relative locations between the second well region 102 and the third conductive region 113, the layout configurations of the FIGS. 1B and 1C are substantially identical.

Figure 2A:
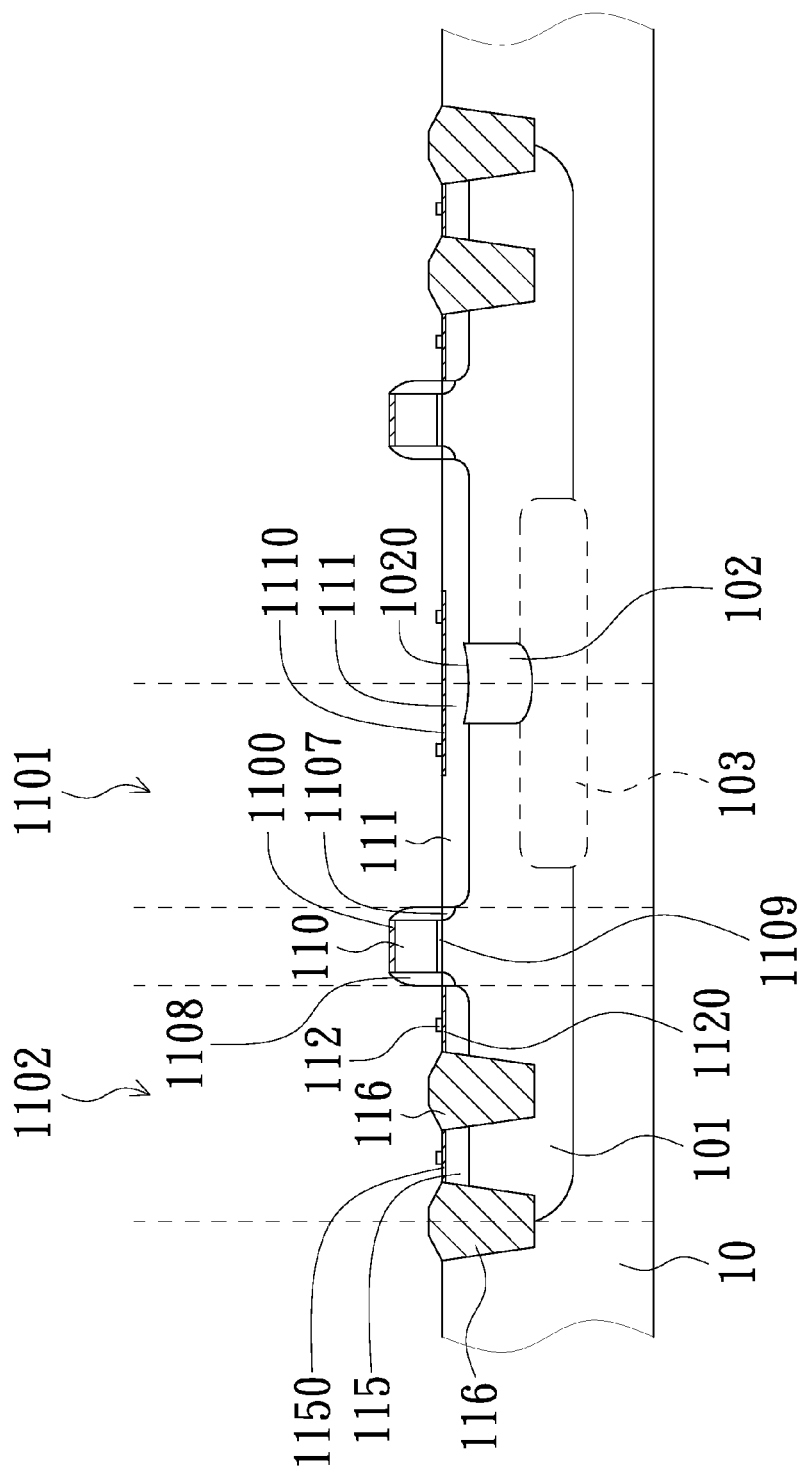
FIG. 2A is a schematic cross-sectional view illustrating an electrostatic discharge protection structure according to a second embodiment of the present invention.
Figure 2B:
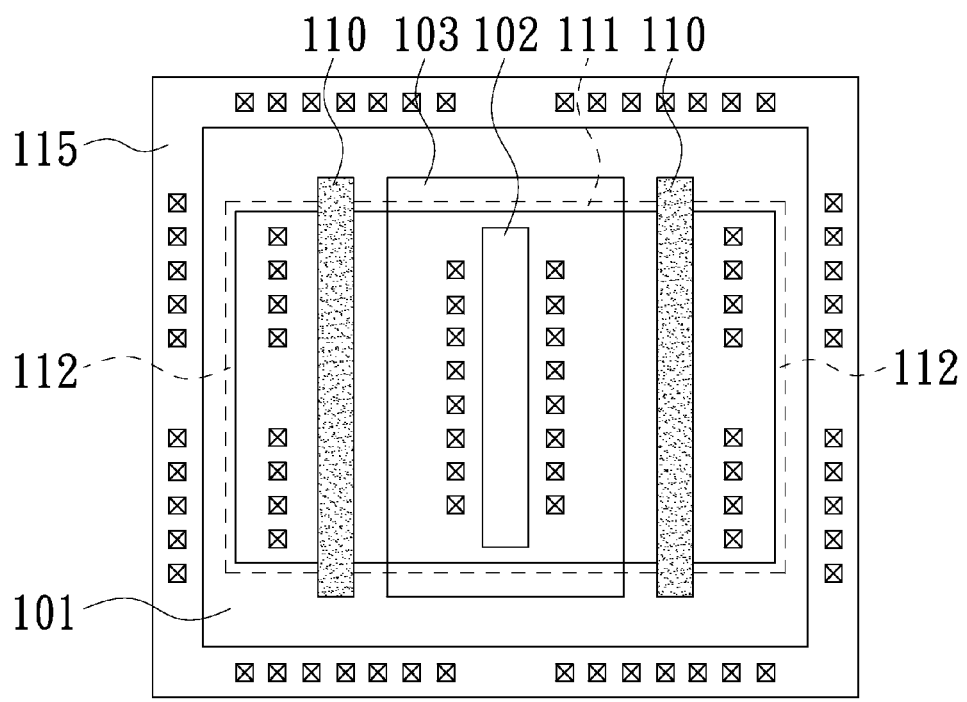
FIG. 2B is a schematic top view illustrating the electrostatic discharge protection structure of FIG. 2A.
Figure 2C:
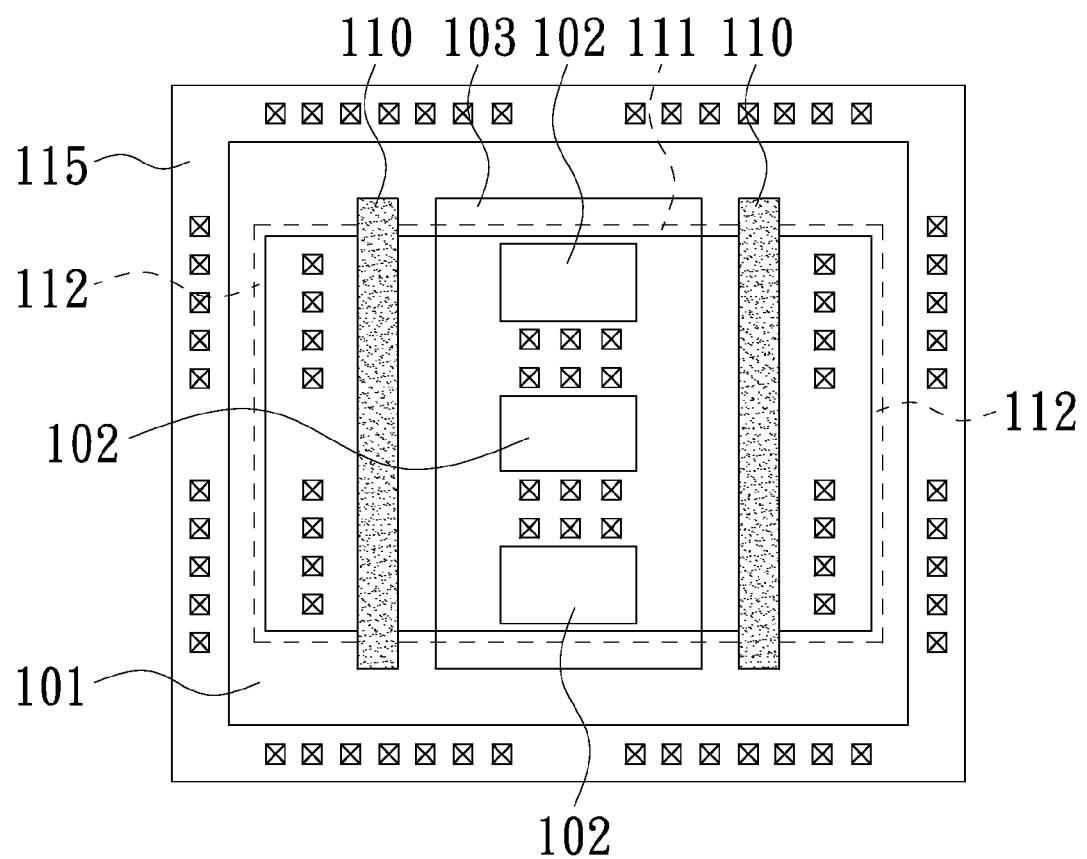
FIG. 2C is a schematic top view illustrating a variation of the electrostatic discharge protection structure of FIG. 2A.

FIG. 2A is a schematic cross-sectional view illustrating an electrostatic discharge protection structure according to a second embodiment of the present invention. FIG. 2B is a schematic top view illustrating the electrostatic discharge protection structure of FIG. 2A. FIG. 2C is a schematic top view illustrating a variation of the electrostatic discharge protection structure of FIG. 2B. In comparison with the first embodiment of FIGS. 1A~1C, the third conductive region 113 is not included in the electrostatic discharge protection structure of this embodiment. In a case where the breakdown voltage of the parasitic bipolar junction transistor does not need to be adjusted, the electrostatic discharge protection structure of this embodiment is feasible. The other components of the electrostatic discharge protection structure of the second embodiment are similar to those of the first embodiment, and are not redundantly described herein.

Figure 3A:
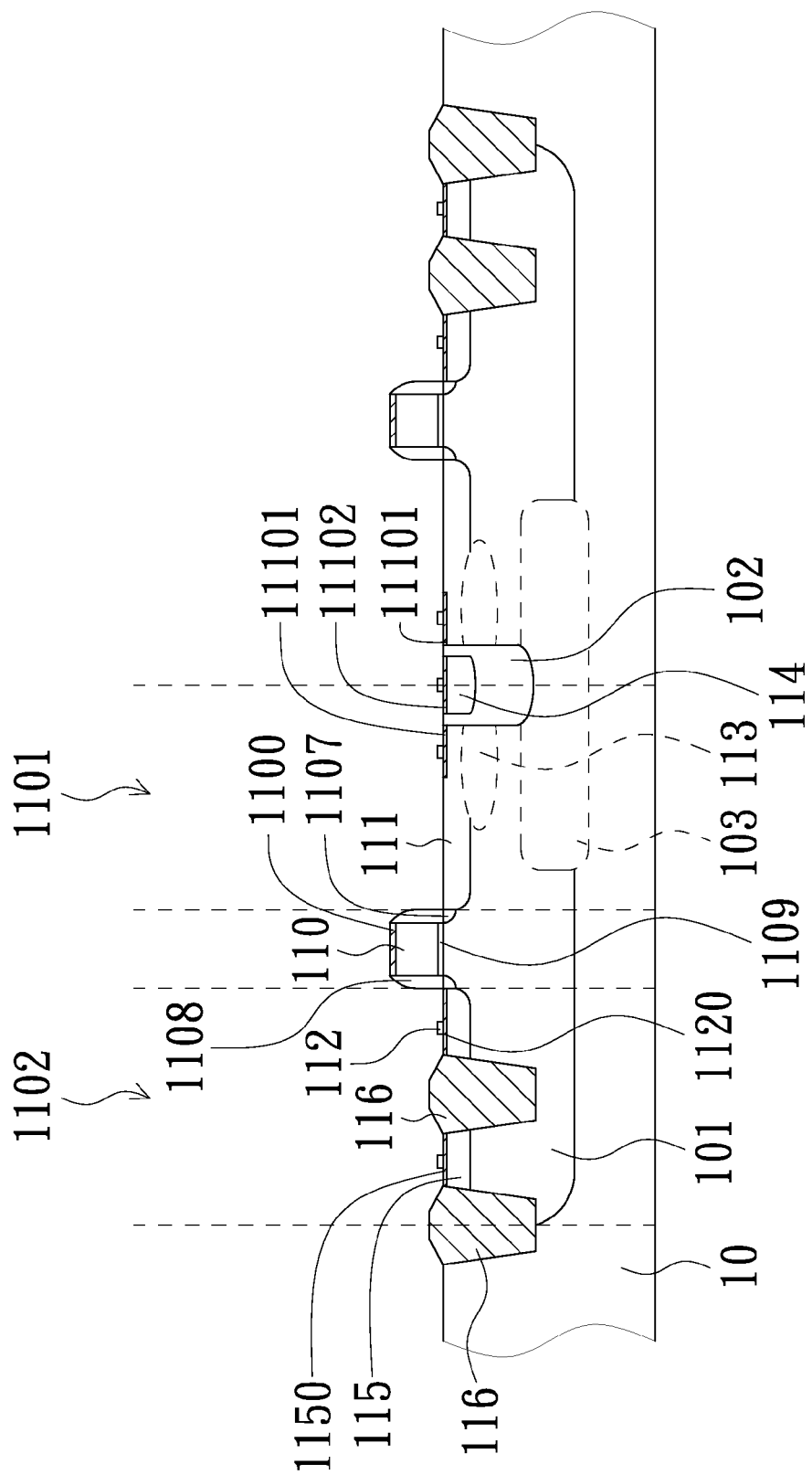
FIG. 3A is a schematic cross-sectional view illustrating an electrostatic discharge protection structure according to a third embodiment of the present invention.
Figure 3B:
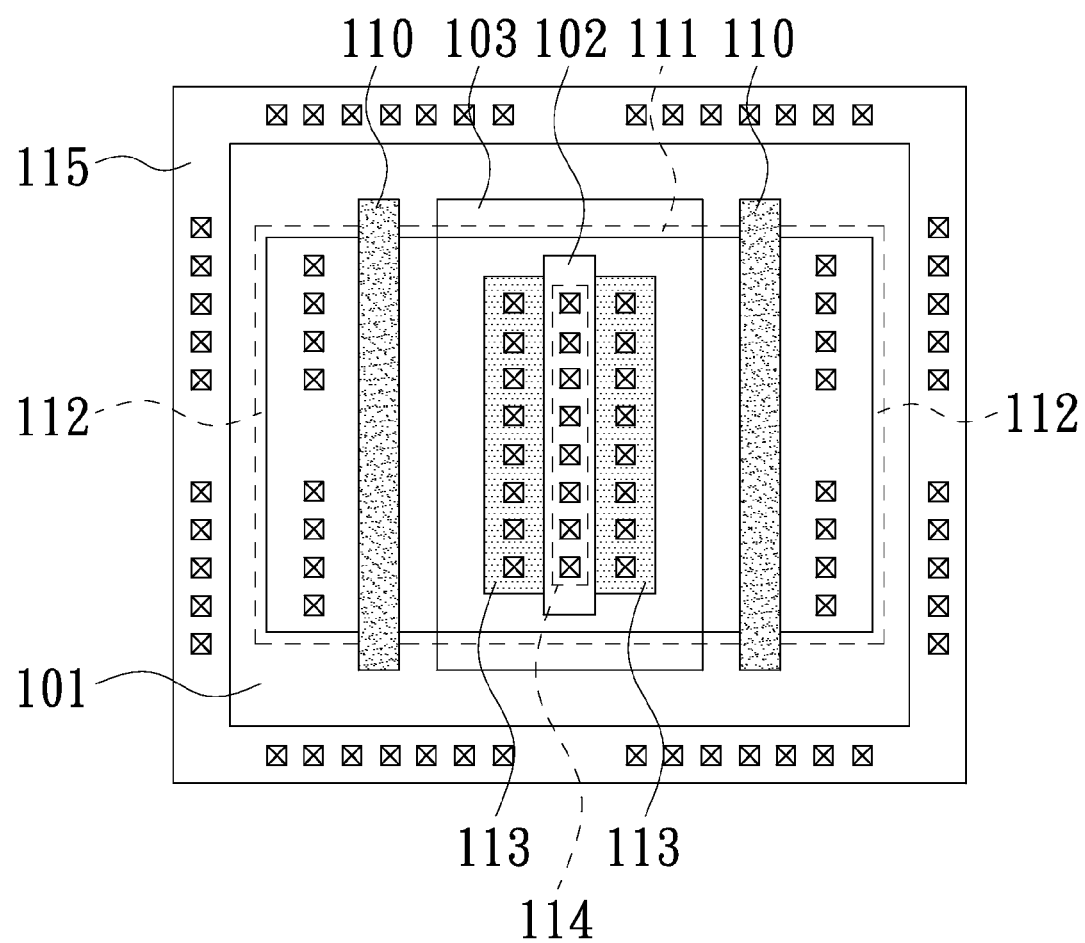
FIG. 3B is a schematic top view illustrating the electrostatic discharge protection structure of FIG. 3A.
Figure 3C:
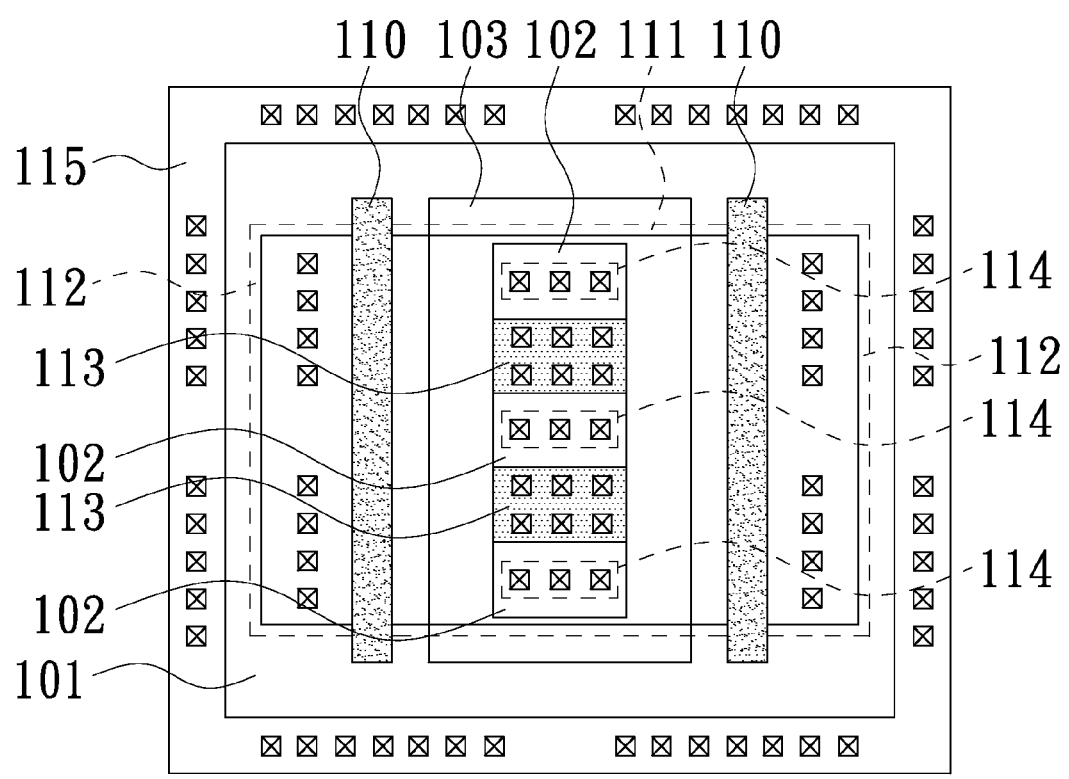
FIG. 3C is a schematic top view illustrating a variation of the electrostatic discharge protection structure of FIG. 3A.

FIG. 3A is a schematic cross-sectional view illustrating an electrostatic discharge protection structure according to a third embodiment of the present invention. FIG. 3B is a schematic top view illustrating the electrostatic discharge protection structure of FIG. 3A. FIG. 3C is a schematic top view illustrating a variation of the electrostatic discharge protection structure of FIG. 3B. In comparison with FIGS. 1A~1C, the electrostatic discharge protection structure of this embodiment further comprises a fourth conductive region 114. The fourth conductive region 114 is formed in the surface of the semiconductor substrate 10. In addition, a sidewall of the fourth conductive region 114 is enclosed by the second well region 102. The fourth conductive region 114 contains the first type conducting carriers (e.g. hole carriers). In addition, the concentration of the first type conducting carriers of the fourth conductive region 114 is higher than the concentration of the first type conducting carriers of the first well region 101. In this embodiment, the drain contact region of the electrostatic discharge protection structure is divided into a first drain contact region 11101 and a second drain contact region 11102. The first drain contact region 11101 is disposed on a surface of the first conductive region 111. The second drain contact region 11102 is disposed on a surface of the fourth conductive region 114. The other components of the electrostatic discharge protection structure of the third embodiment are similar to those of the above embodiments, and are not redundantly described herein.

Figure 4A:
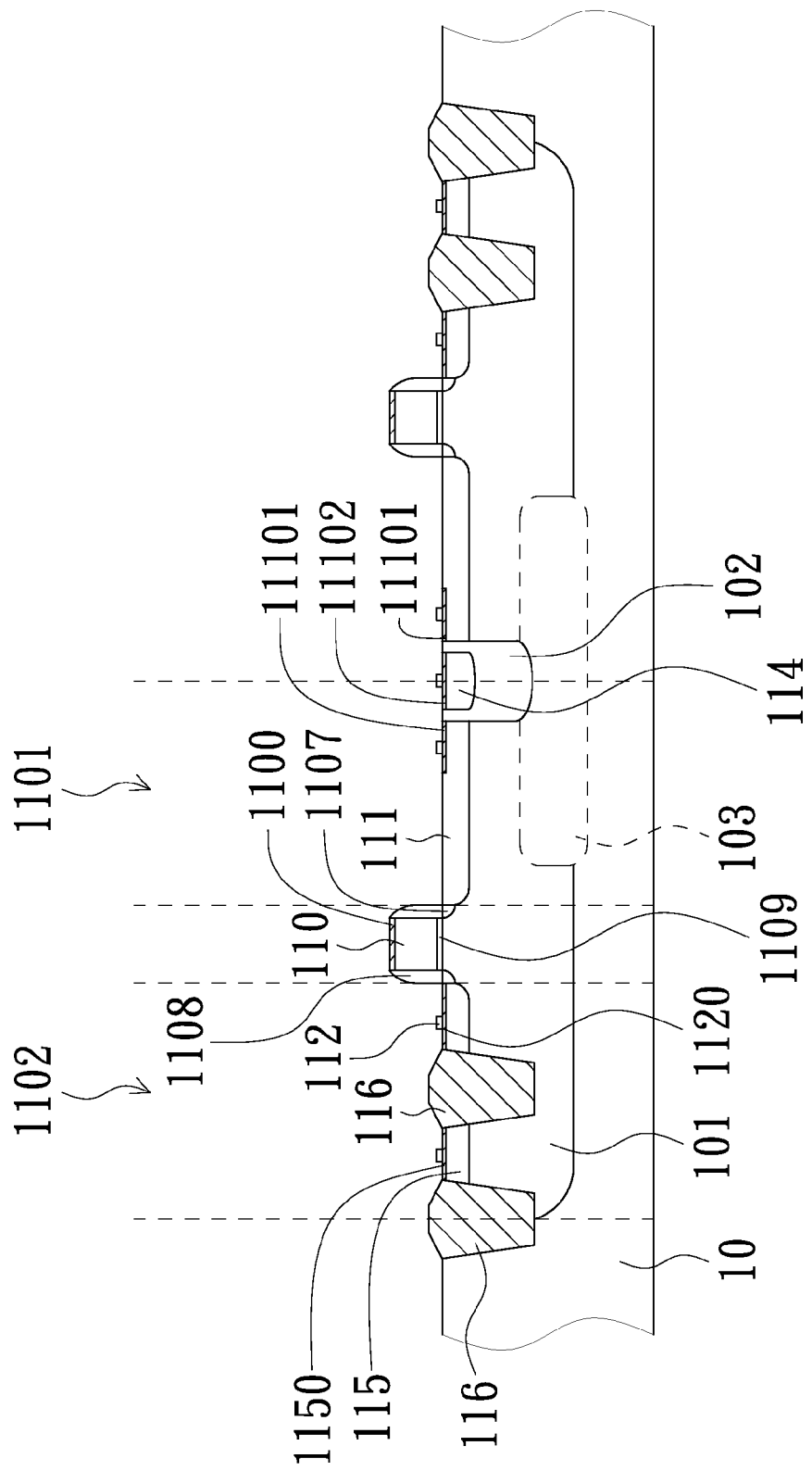
FIG. 4A is a schematic cross-sectional view illustrating an electrostatic discharge protection structure according to a fourth embodiment of the present invention.
Figure 4B:
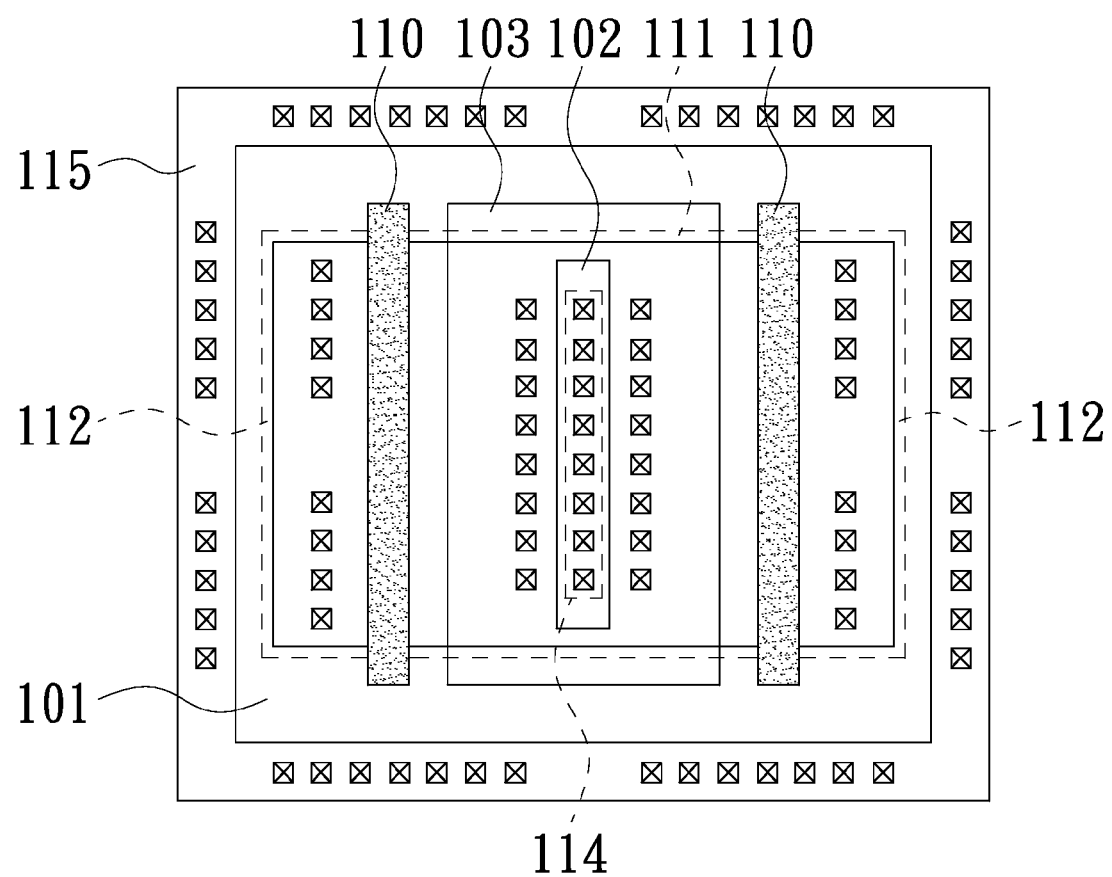
FIG. 4B is a schematic top view illustrating the electrostatic discharge protection structure of FIG. 4A.
Figure 4C:
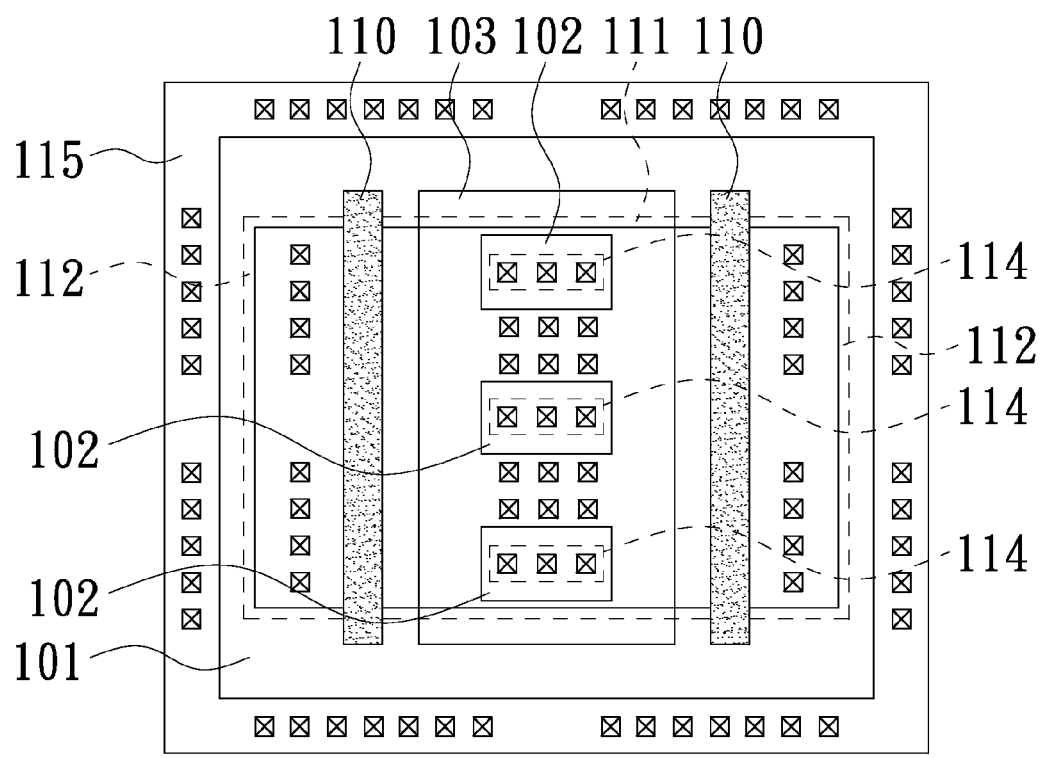
FIG. 4C is a schematic top view illustrating a variation of the electrostatic discharge protection structure of FIG. 4A.

FIG. 4A is a schematic cross-sectional view illustrating an electrostatic discharge protection structure according to a fourth embodiment of the present invention. FIG. 4B is a schematic top view illustrating the electrostatic discharge protection structure of FIG. 4A. FIG. 4C is a schematic top view illustrating a variation of the electrostatic discharge protection structure of FIG. 4B. In comparison with the third embodiment of FIGS. 3A~3C, the third conductive region 113 is not included in the electrostatic discharge protection structure of this embodiment. In a case where the breakdown voltage of the parasitic bipolar junction transistor does not need to be adjusted, the electrostatic discharge protection structure of this embodiment is thus feasible. The other components of the electrostatic discharge protection structure of the fourth embodiment are similar to those of the above embodiments, and are not redundantly described herein.

Figure 5A:
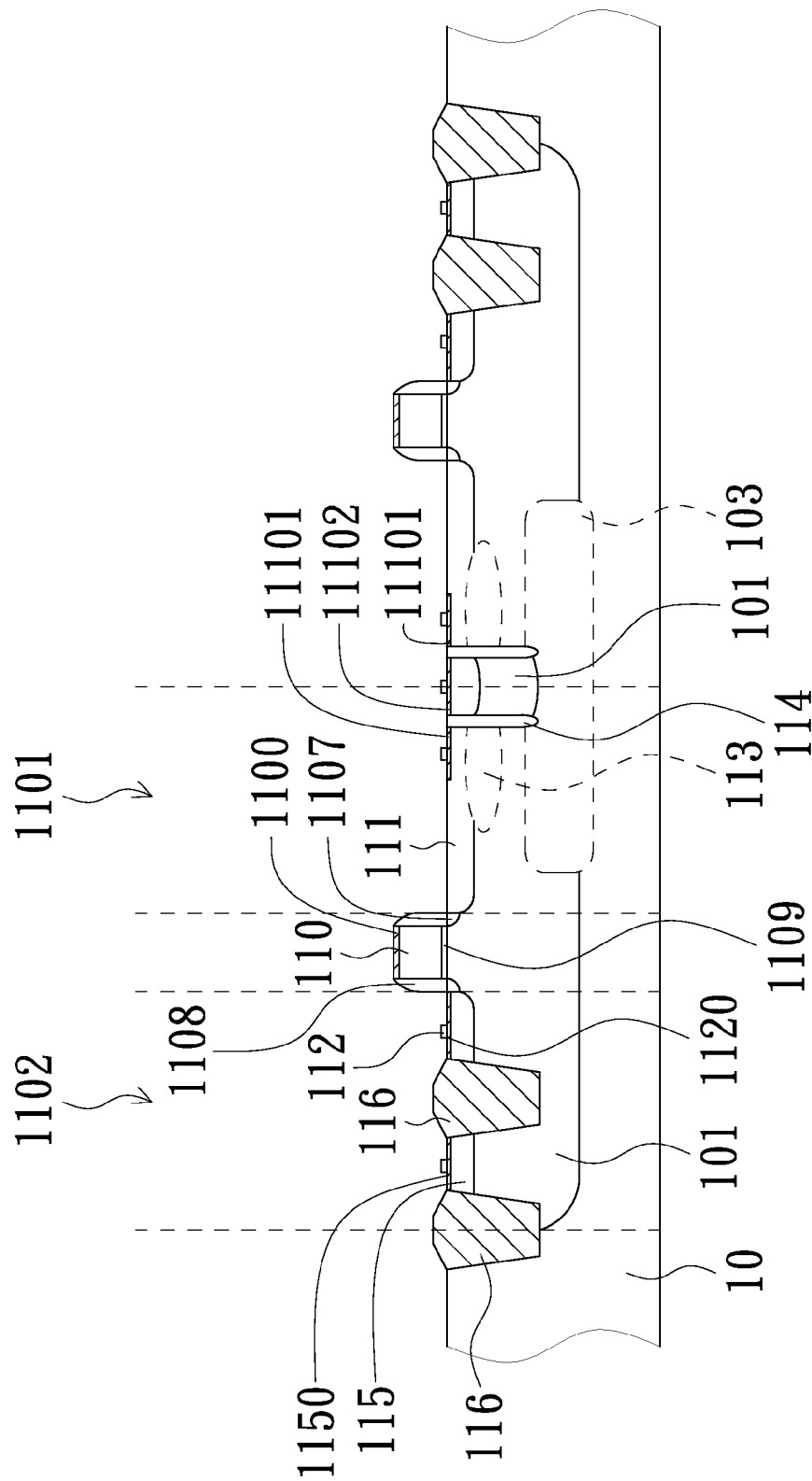
FIG. 5A is a schematic cross-sectional view illustrating an electrostatic discharge protection structure according to a fifth embodiment of the present invention.
Figure 5B:
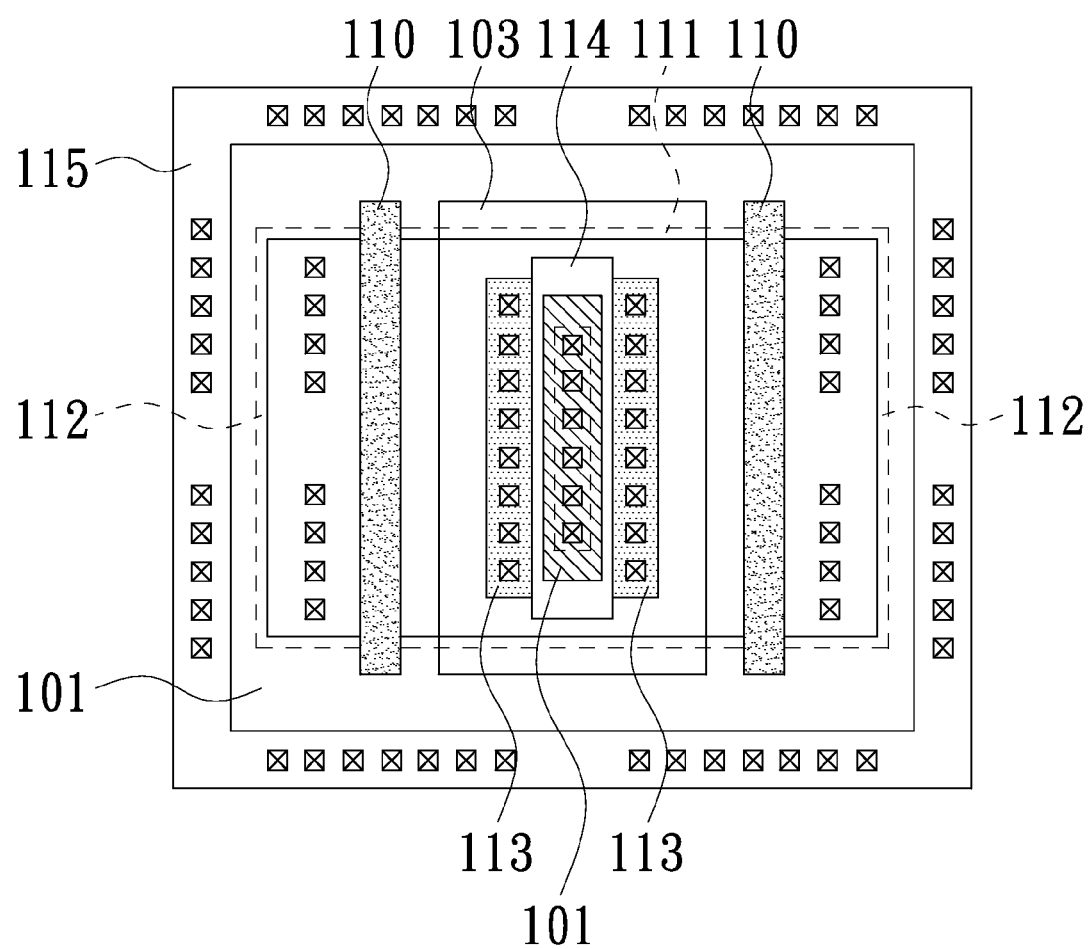
FIG. 5B is a schematic top view illustrating the electrostatic discharge protection structure of FIG. 5A.

FIG. 5A is a schematic cross-sectional view illustrating an electrostatic discharge protection structure according to a fifth embodiment of the present invention. FIG. 5B is a schematic top view illustrating the electrostatic discharge protection structure of FIG. 5A. In comparison with the third embodiment of FIGS. 3A~3B, the profile of the second well region 102 of the electrostatic discharge protection structure of this embodiment is distinguished. Consequently, the fourth conductive region 114 is separated from the deep well region 103 by the first well region 101. By the electrostatic discharge protection structure of this embodiment, the drawbacks of causing the low holding voltage from the snapback breakdown condition of the parasitic bipolar junction transistor can be also effectively solved. The other components of the electrostatic discharge protection structure of the fourth embodiment are similar to those of the above embodiments, and are not redundantly described herein.

Figure 6A:
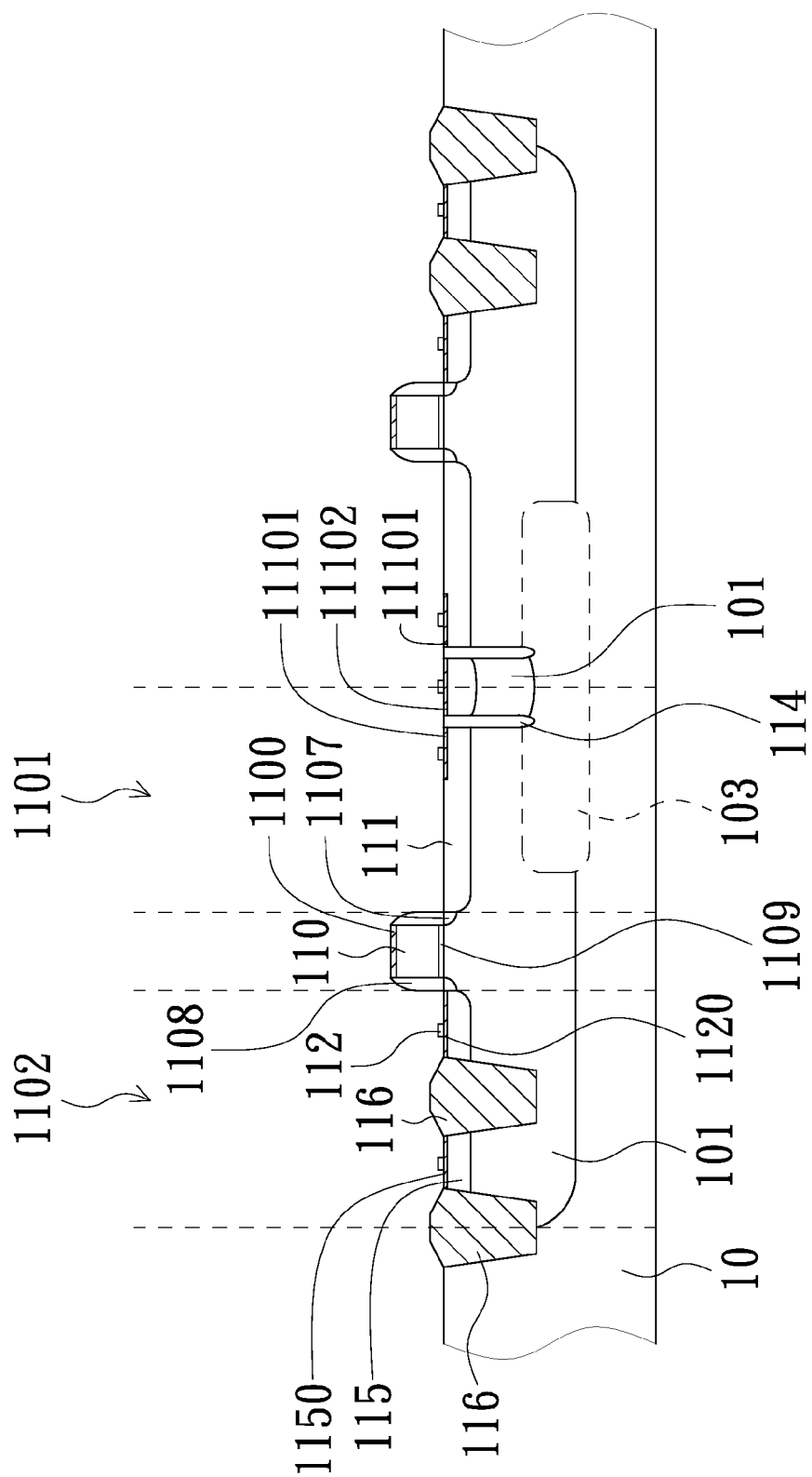
FIG. 6A is a schematic cross-sectional view illustrating an electrostatic discharge protection structure according to a sixth embodiment of the present invention.
Figure 6B:
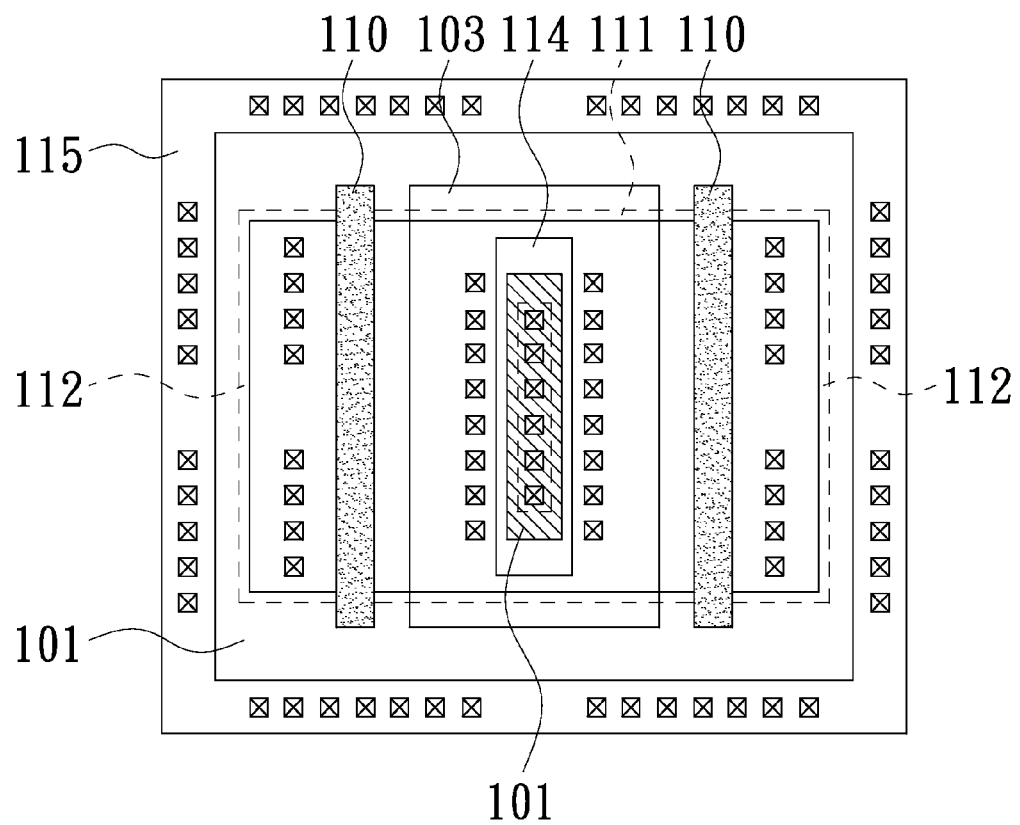
FIG. 6B is a schematic top view illustrating the electrostatic discharge protection structure of FIG. 6A.

FIG. 6A is a schematic cross-sectional view illustrating an electrostatic discharge protection structure according to a sixth embodiment of the present invention. FIG. 6B is a schematic top view illustrating the electrostatic discharge protection structure of FIG. 6A. In comparison with the fifth embodiment of FIGS. 5A~5B, the third conductive region 113 is not included in the electrostatic discharge protection structure of this embodiment. In a case where the breakdown voltage of the parasitic bipolar junction transistor does not need to be adjusted, the electrostatic discharge protection structure of this embodiment is feasible. The other components of the electrostatic discharge protection structure of the sixth embodiment are similar to those of the above embodiments, and are not redundantly described herein.

From the above descriptions, the present invention provides an electrostatic discharge protection structure. In the electrostatic discharge protection structure of the present invention, the combination of the second well region 102 and the deep well region 103 provides an additional current path for discharging the electrostatic discharge current. Consequently, the drawbacks of causing the low holding voltage from the snapback breakdown condition of the parasitic bipolar junction transistor can be solved.

Figure 7:
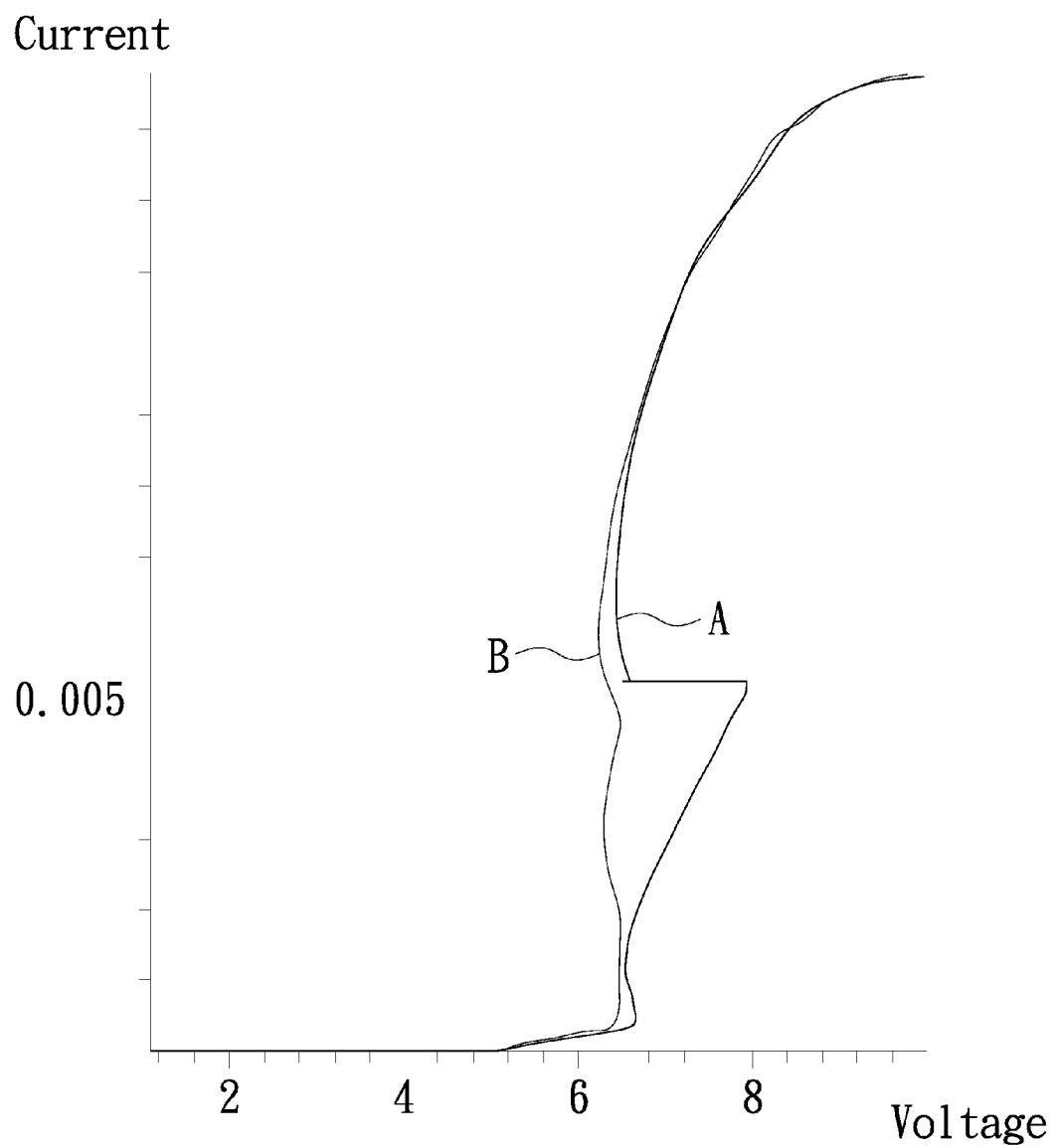
FIG. 7 schematically illustrates the relationships between the voltage and current of a conventional electrostatic discharge protection structure and of the electrostatic discharge protection structure of the first embodiment of present invention.

FIG. 7 schematically illustrates the relationships between the voltage and the current of a conventional electrostatic discharge protection structure and of the electrostatic discharge protection structure of the first embodiment of the present invention. As shown in FIG. 7, the conventional electrostatic discharge protection structure has a characteristic curve A, and the present electrostatic discharge protection structure has a characteristic curve B. As shown in the characteristic curve B, the holding voltage of the present electrostatic discharge protection structure in the snapback breakdown condition is maintained at a specified voltage.

In the above embodiments, the semiconductor substrate 10 used in the electrostatic discharge protection structure of the present invention is a silicon substrate, a germanium substrate or a compound semiconductor substrate.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electrostatic discharge protection structure, comprising:
a semiconductor substrate;
a first well region disposed in the semiconductor substrate, and containing first type conducting carriers;
a gate structure disposed over a surface of the first well region;
a second well region disposed within the first well region, and located at a first side of the gate structure, wherein the second well region contains second type conducting carriers;
a first conductive region disposed on the surface of the first well region, and arranged between the gate structure and the second well region, wherein the first conductive region contains the second type conducting carriers;
a second conductive region disposed on the surface of the first well region, and located at a second side of the gate structure, wherein the second conductive region contains the second type conducting carriers;
a deep well region disposed under the second well region and the first conductive region, and contacted with the second well region, wherein the deep well region is separated from the first conductive region by the first well region, wherein the deep well region contains the second type conducting carriers; and
a third conductive region arranged between the second well region, the first conductive region and the deep well region, wherein the third conductive region is contacted with a bottom surface of the first conductive region.

2. The electrostatic discharge protection structure according to claim 1, wherein the concentration of the second type conducting carriers of the deep well region is lower than the concentration of the second type conducting carriers of the second well region.

3. The electrostatic discharge protection structure according to claim 1, wherein the concentration of the second type conducting carriers of the second well region is lower than the concentration of the second type conducting carriers of the first conductive region, and the concentration of the second type conducting carriers of the second well region is lower than the concentration of the second type conducting carriers of the second conductive region.

4. The electrostatic discharge protection structure according to claim 1, wherein the third conductive region contains the first type conducting carriers, and the concentration of the first type conducting carriers of the third conductive region is higher than the concentration of the first type conducting carriers of the first well region.

5. The electrostatic discharge protection structure according to claim 4, wherein the third conductive region is separated from the deep well region by the first well region.

6. The electrostatic discharge protection structure according to claim 1, wherein the first well region, the gate structure, the first conductive region and the second conductive region are defined as a metal-oxide-semiconductor structure, wherein the first conductive region is used as a drain region of the metal-oxide-semiconductor structure, and the second conductive region is used as a source region of the metal-oxide-semiconductor structure.

7. The electrostatic discharge protection structure according to claim 6, wherein a top surface of the second well region is contacted with the first conductive region.

8. The electrostatic discharge protection structure according to claim 6, further comprising a drain contact region, wherein the drain contact region is disposed on a surface of the first conductive region, and the entire second well region is covered by a projection area of the drain contact region.

9. The electrostatic discharge protection structure according to claim 1, further comprising a fourth conductive region, wherein the fourth conductive region is formed in a surface of the semiconductor substrate, and a sidewall of the fourth conductive region is enclosed by the second well region, wherein the fourth conductive region contain the first type conducting carriers, and the concentration of the first type conducting carriers of the fourth conductive region is higher than the concentration of the first type conducting carriers of the first well region.

10. The electrostatic discharge protection structure according to claim 9, further comprising a first drain contact region and a second drain contact region, wherein the first drain contact region is disposed on a surface of the first conductive region, and the second drain contact region is disposed on a surface of the fourth conductive region.

11. The electrostatic discharge protection structure according to claim 9, wherein the fourth conductive region is separated from the deep well region by the first well region.

12. The electrostatic discharge protection structure according to claim 1, further comprising a gate contact region and a source contact region, wherein the gate contact region is disposed on a surface of the gate structure, and the source contact region is disposed on a surface of the second conductive region.

13. The electrostatic discharge protection structure according to claim 1, further comprising a fifth conductive region and a body contact region, wherein the fifth conductive region is disposed within the first well region, and the body contact region is formed on a surface of the fifth conductive region, wherein the fifth conductive region contains the first type conducting carriers, and the concentration of the first type conducting carriers of the fifth conductive region is higher than the concentration of the first type conducting carriers of the first well region.

14. The electrostatic discharge protection structure according to claim 1, wherein the first conductive region is wider than the second conductive region.

* * * * *